United States Patent
Ouyang

(10) Patent No.: US 7,423,874 B2
(45) Date of Patent: *Sep. 9, 2008

(54) MAGNETO-HYDRODYNAMIC HEAT SINK

(75) Inventor: Chien Ouyang, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 261 days.

This patent is subject to a terminal disclaimer.

(21) Appl. No.: 11/219,964

(22) Filed: Sep. 6, 2005

(65) Prior Publication Data

US 2007/0053152 A1    Mar. 8, 2007

(51) Int. Cl.
*H05K 7/20* (2006.01)
*F28D 15/00* (2006.01)
*H01L 23/34* (2006.01)

(52) U.S. Cl. ............... 361/699; 257/714; 174/15.1; 165/80.4; 165/104.33

(58) Field of Classification Search ......... 361/699–702; 257/714; 174/15.1, 15.2, 252; 165/80.4, 165/80.5, 104.33

See application file for complete search history.

(56) References Cited

U.S. PATENT DOCUMENTS

| | | | |
|---|---|---|---|
| 5,355,942 A | | 10/1994 | Conte |
| 5,763,951 A | * | 6/1998 | Hamilton et al. ............ 257/714 |
| 6,766,817 B2 | | 7/2004 | da Silva et al. |
| 6,856,037 B2 | * | 2/2005 | Yazawa et al. ................ 290/43 |
| 6,918,404 B2 | | 7/2005 | Dias da Silva et al. |
| 7,066,586 B2 | | 6/2006 | da Silva et al. |
| 7,126,822 B2 | * | 10/2006 | Hu et al. ..................... 361/699 |
| 2006/0120878 A1 | * | 6/2006 | Ghoshal et al. .............. 417/48 |
| 2006/0158849 A1 | * | 7/2006 | Martin et al. ............... 361/699 |

OTHER PUBLICATIONS

High-Performance Liquid Metal Cooling Loops Authors: U. Ghoshal, D. Grimm, S. Ibrani, C. Johnston, and A. Miner nanoCoolers, Inc. as published in the 21st IEEE Semi-Therm Symposium Sep. 2005; 4 pages.
Free Surface Heat Transfer and Innovative Designs for Thin and Thick Liquid Walls Authors: A.Y. Ying, N. Morley, S. Smolentsev, K. Gulec, and P. Fogarty Mechanical & Aerospace Engineering Department UCLA, Los Angeles, CA 90095 Draft copy submitted to ISFNT-5; Rome Sep. 1999; pp. 1-8.

* cited by examiner

*Primary Examiner*—Jayprakash N Gandhi
*Assistant Examiner*—Zachary M Pape
(74) *Attorney, Agent, or Firm*—Osha Liang LLP

(57) ABSTRACT

A heat sink uses a pump assembly to generate a magnetic field. A direction of electrically and thermally conductive liquid flowing through the pump assembly is dependent on an orientation of the magnetic field and the direction of electrical current induced across flowing fluid in the magnetic field. In such a manner, cool liquid may be directed toward a heat source and warmer liquid may be directed to flow away from the heat source, where heat transfer occurs between the liquid and the heat sink. Additional pump assemblies that generate separate magnetic fields may be used to increase fluid flow volume, thereby increasing heat transfer away from the heat source.

11 Claims, 9 Drawing Sheets

MAGNETO-HYDRODYNAMIC HEAT SINK

CROSS-REFERENCE TO RELATED APPLICATIONS

The present application contains subject matter that may be related to the subject matter in the following U.S. applications filed on Sep. 6, 2005 and assigned to the assignee of the present application: "Magneto-Hydrodynamic Heat Sink" Ser. No. 11/220,177; and "Magneto-Hydrodynamic Heat Sink" Ser. No. 11/219,965.

BACKGROUND

A computer system 10, as shown in FIG. 1, includes several components that are collectively used by a user to perform various functions such as, for example, preparing and generating a document with a word processor application. With the computer system 10, the user may input data to a computing portion 12 using peripheral devices such as a keyboard 14 or a mouse 16. Data may also be provided to the computing portion 12 using data storage media (e.g., a floppy disk or a CD-ROM (not shown)). The computing portion 12, using memory and other internal components, processes both internal data and data provided to the computing portion 12 by the user to generate data requested by the user. The generated data may be provided to the user via, for example, a display device 18 or a printer 20. The computing portion 12 of a computer system typically includes various components such as, for example, a power supply, disk drives, and the electrical circuitry required to perform the necessary and requested operations of the computer system.

As shown in FIG. 2, the computing portion 12 may contain a plurality of circuit boards 22, 24, 26, 28 (e.g., printed circuit boards (PCBs) or printed wiring boards (PWBs)) on which various circuit components are implemented. For example, a computing portion designed to have enhanced sound reproducing capabilities may have a circuit board dedicated to implementing circuitry that specifically operate to process data associated with the reproduction of sound.

In FIG. 2, the components of exemplary circuit board 22 are shown. A crystal oscillator 30 provides a reference of time to various integrated circuits (ICs) 32, 34, 36, 38, 40, 42 (e.g., application specific integrated circuits (ASICs), field-programmable gate arrays (FPGAs), microprocessors, logic gates) that are connected to the circuit board 22. The integrated circuits 32, 34, 36, 38, 40, 42 communicate with one another, i.e., pass data, using wires or traces of conductive material (e.g., copper (shown, but not labeled)) embedded in the circuit board 22.

In operation, an integrated circuit, such as those shown in FIG. 2, dissipates heat as a result of work performed by the integrated circuit. Energy that is needed by the integrated circuit for work is not consumed with 100% efficiency, thereby resulting in excess energy that is released, among other things, as heat. As integrated circuits become more dense (i.e., more transistors per unit area) and faster (i.e., higher operating frequencies), they generate more heat. As excessive heat is damaging to an integrated circuit both in terms of performance and component integrity, an important design consideration involves ensuring that heat dissipated by an integrated circuit is sufficiently drawn away from the integrated circuit, where the efficiency of drawing away heat from the integrated circuit is expressed in terms of what is referred to as the "heat transfer rate."

"Heat sinks" are devices that are commonly used to cool integrated circuits. FIG. 3 shows a heat sink 50 as used with an integrated circuit 52 housed in a package 54 atop a substrate 56. The heat sink 50 is made of a high thermal conductivity metal (e.g., copper or aluminum). A "high thermal conductivity metal" is one that allows heat to pass through it because it contains many free electrons.

A base of the heat sink 50 is secured over the integrated circuit 52 by, for example, a retention clip (not shown) or an adhesive or thermal interface material (shown, but not labeled). During operation of the integrated circuit 52, the temperature of the integrated circuit 52 increases due to increased particle movement resulting from a build-up of excess energy. The increased integrated circuit temperature results in an increase in the temperature of the package 54, and consequently, of the heat sink 50. The increased temperature of the heat sink 50 results in an increase in the temperature of the air around the heat sink 50, whereby the heated air rises and effectively draws heat away from the integrated circuit 52. This process is referred to as "convection."

The removal of heat dissipated from an integrated circuit by a heat sink is dependent on numerous factors. For example, the thermal resistance of the package that houses the integrated circuit affects how much heat transfers from the integrated circuit to the heat sink. Also, the effectiveness of the adhesives between the integrated circuit and its package and the package and the heat sink affects how much heat transfers between these components. Moreover, the conductivity of the materials used in the package and the heat sink has a direct bearing on the amount of heat that is transferred away from the integrated circuit. The surface area of the heat sink is also important as more surface area results in more air being heated, thereby resulting in more heat being drawn away from the integrated circuit by the rising heated air.

SUMMARY

According to one aspect of one or more embodiments of the present invention, a computer system comprises an integrated circuit and a heat sink operatively connected to the integrated circuit, where the heat sink comprises: a pump assembly through which a single channel of thermally and electrically conductive fluid is arranged to flow, where the pump assembly is arranged to generate a magnetic field across a portion of the single channel residing in the pump assembly, and where a direction of fluid flow in the single channel through the heat sink is dependent on an electrical current induced through the magnetic field.

According to another aspect of one or more embodiments of the present invention, a method of cooling an integrated circuit with a heat sink comprises: generating a magnetic field across a portion of a single channel of thermally and electrically conductive fluid; inducing electrical current across fluid flowing in the magnetic field; and propagating fluid in the single channel through the heat sink in a direction away from and toward the integrated circuit dependent on the generating and the inducing.

According to another aspect of one or more embodiments of the present invention, a heat sink comprises: a body having a plurality of fins arranged to dissipate heat; a pump assembly disposed on a top surface of the body, the pump assembly arranged to generate a uniform magnetic field; and a channel arranged to propagate electrically and thermally conducive fluid through the body, where the pump assembly is ranged to house a portion of the channel, the channel extending through the pump assembly and at least a portion of the body, and where fluid flow direction in the channel is dependent on the uniform magnetic field and the direction of an electrical current induced across flowing fluid in the magnetic field.

Other aspects and advantages of the invention will be apparent from the following description and the appended claims.

DETAILED DESCRIPTION

Embodiments of the present invention relate to a heat sink that "cools" an integrated circuit using flowing fluid that carries heat away from the integrated circuit. The heat sink uses a plurality of pump assemblies that generate magnetic fields to drive fluid flow. Accordingly, such a heat sink is referred to herein as a "magneto-hydrodynamic" heat sink.

Figure 1:
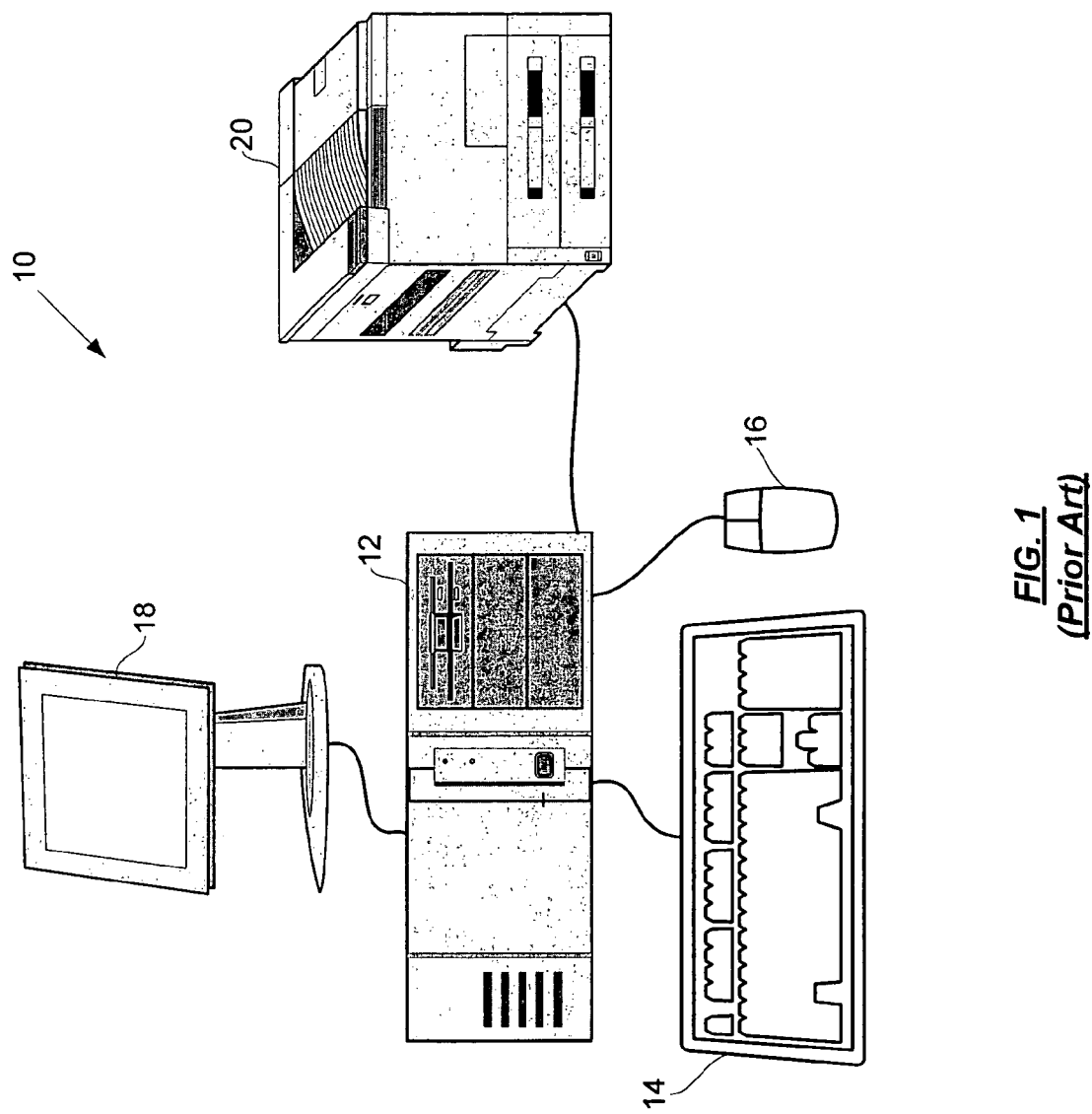
FIG. 1 shows a computer system.
Figure 2:
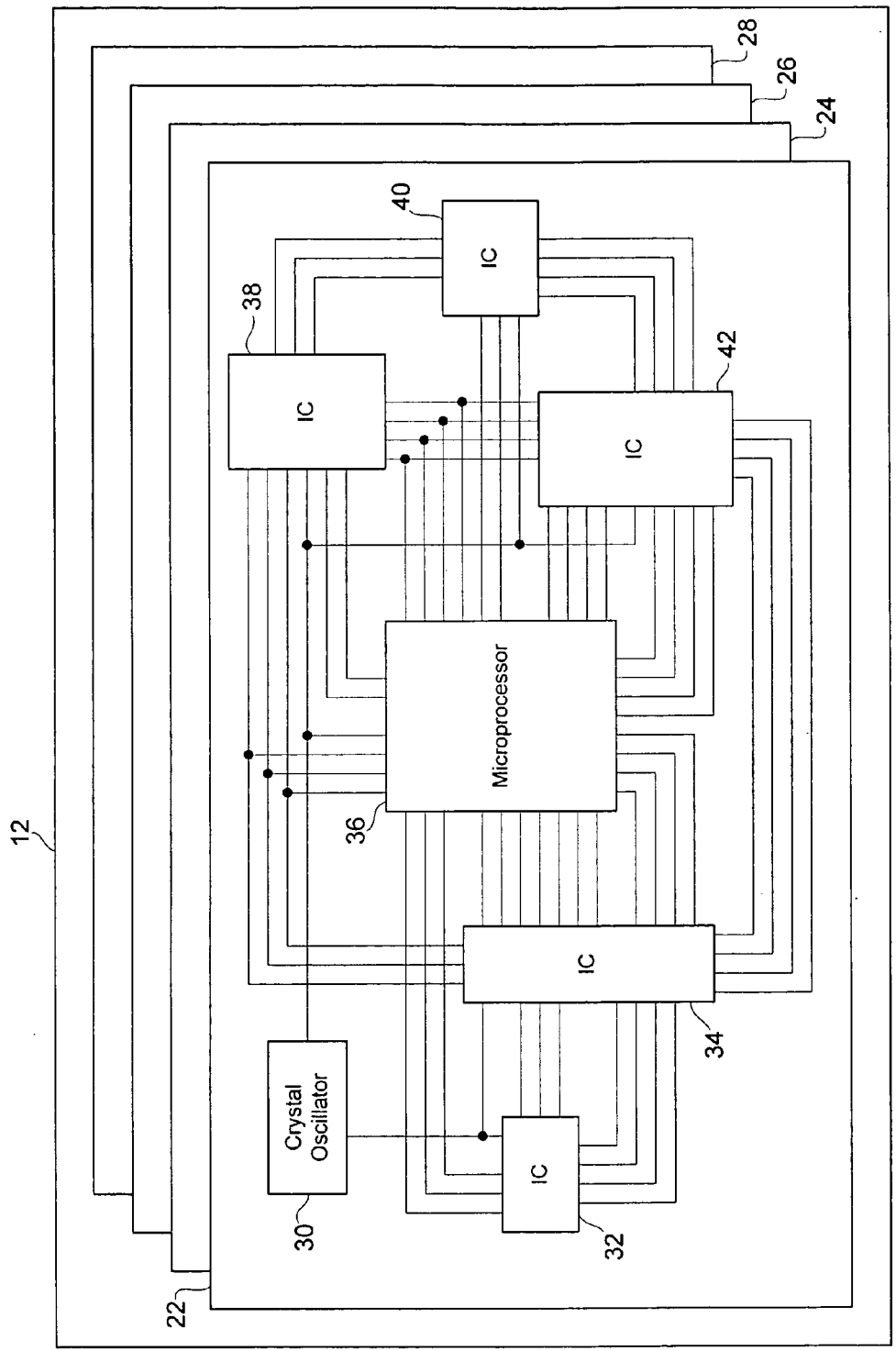
FIG. 2 shows a portion of a computer system.
Figure 3:
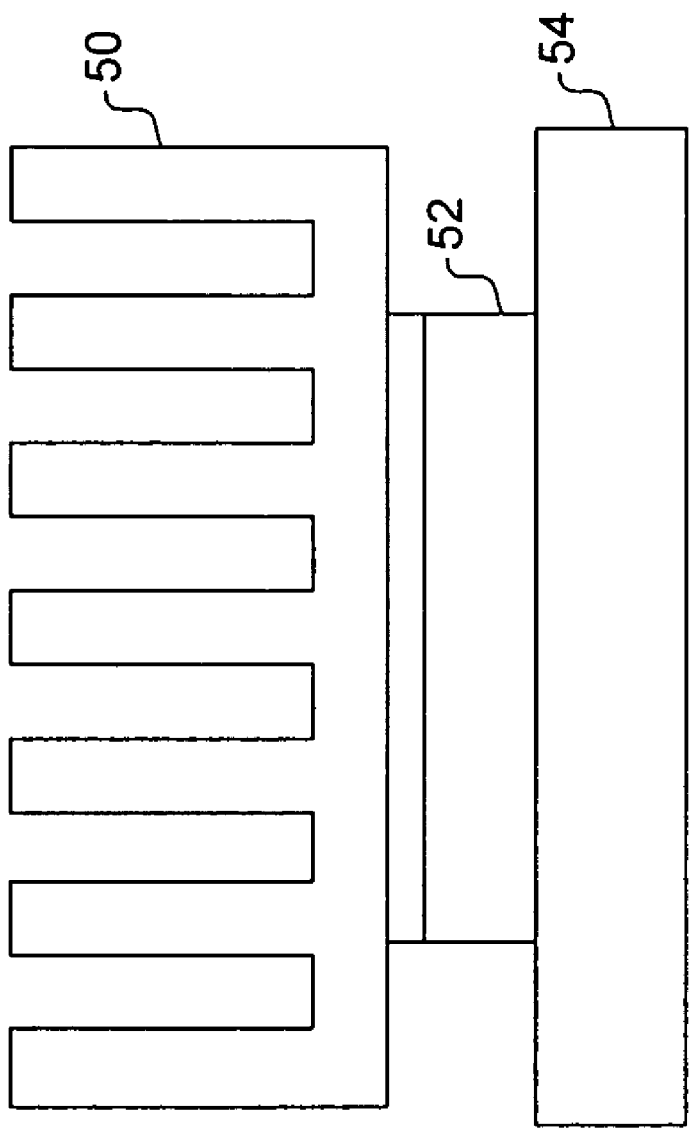
FIG. 3 shows a heat sink as used with an integrated circuit.
Figure 4A:
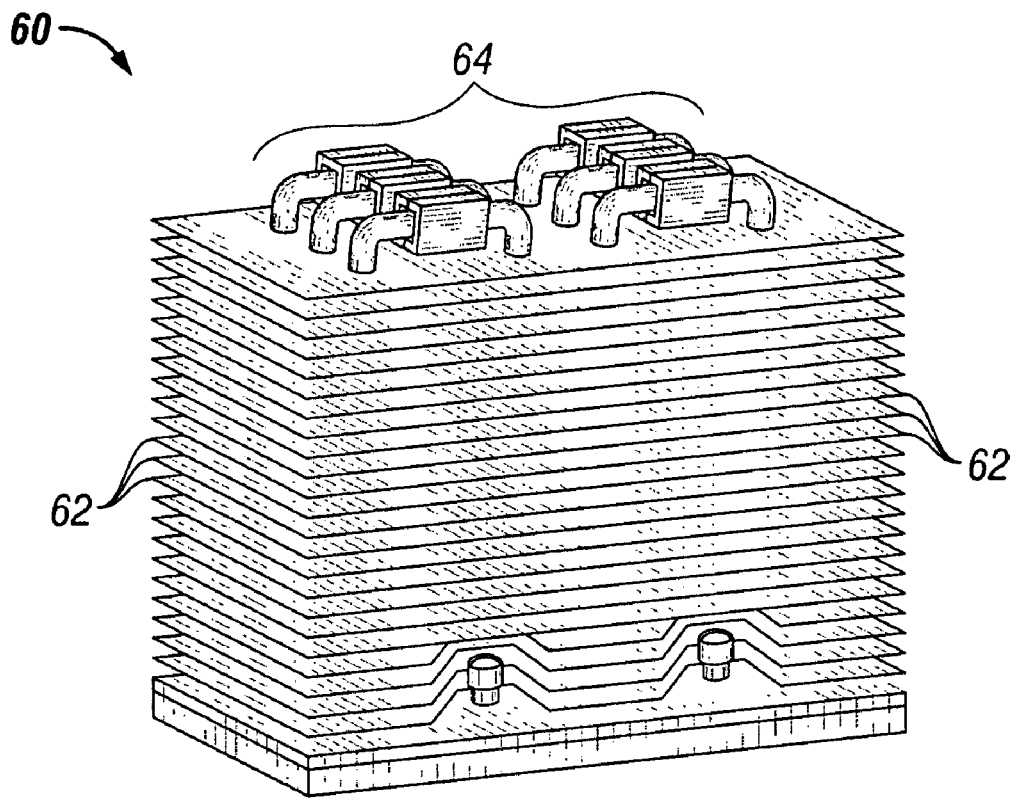
FIG. 4A shows a side view of a heat sink in accordance with an embodiment of the present invention.

FIG. 4A shows a side view of an exemplary heat sink 60 in accordance with an embodiment of the present invention. The heat sink 60 has a number of "fins" 62 that increase the amount of surface area of the heat sink 60 that is exposed to the outside air, thereby resulting in increased heat exchange between the heat sink 60 and the outside air. Pump and pipe assemblies 64 (further described below with reference to FIGS. 5-9) are disposed along a top side of the heat sink 60.

Figure 4B:
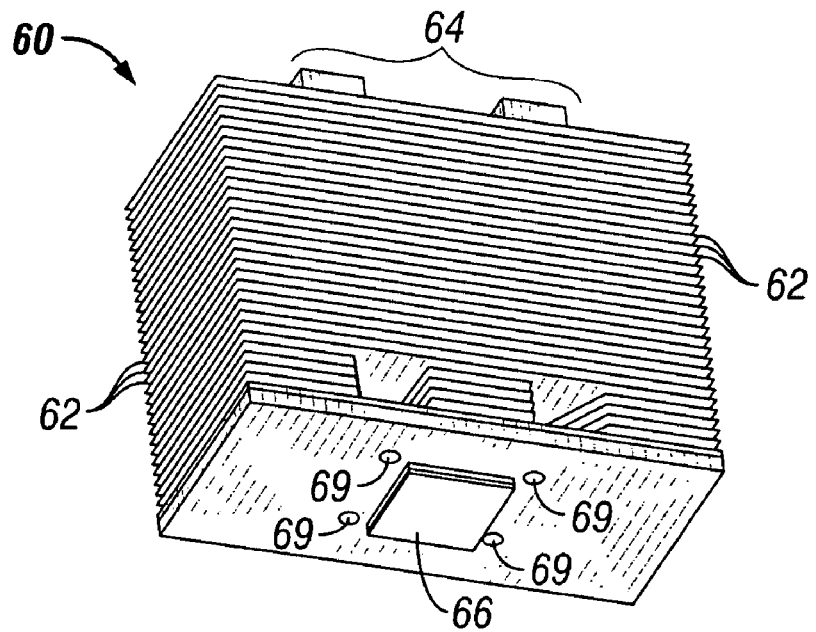
FIG. 4B shows a side view of a heat sink in accordance with an embodiment of the present invention.

As shown in FIG. 4B, a portion 66 of a bottom side of the heat sink 60 is arranged to attach to a heat source (not shown) such as, for example, an integrated circuit. Further, in one or more embodiments of the present invention, the heat sink 60 may be configured with one or more recessed portions for allowing the use of screws 68 to attach the heat sink 60 to a heat source (not shown) as shown in FIG. 4C.

In one or more other embodiments of the present invention, means other than or in addition to screws may be used to attach the heat sink 60 to a heat source. For example, pins, adhesives, and/or clips may be used to attach the heat sink 60 to a heat source. Further, as shown in FIG. 4B, holes 69 may be provided along a bottom side of heat sink 60 for screws (not shown) or other means used for attaching the heat sink 60 to a heat source.

Figure 4C:
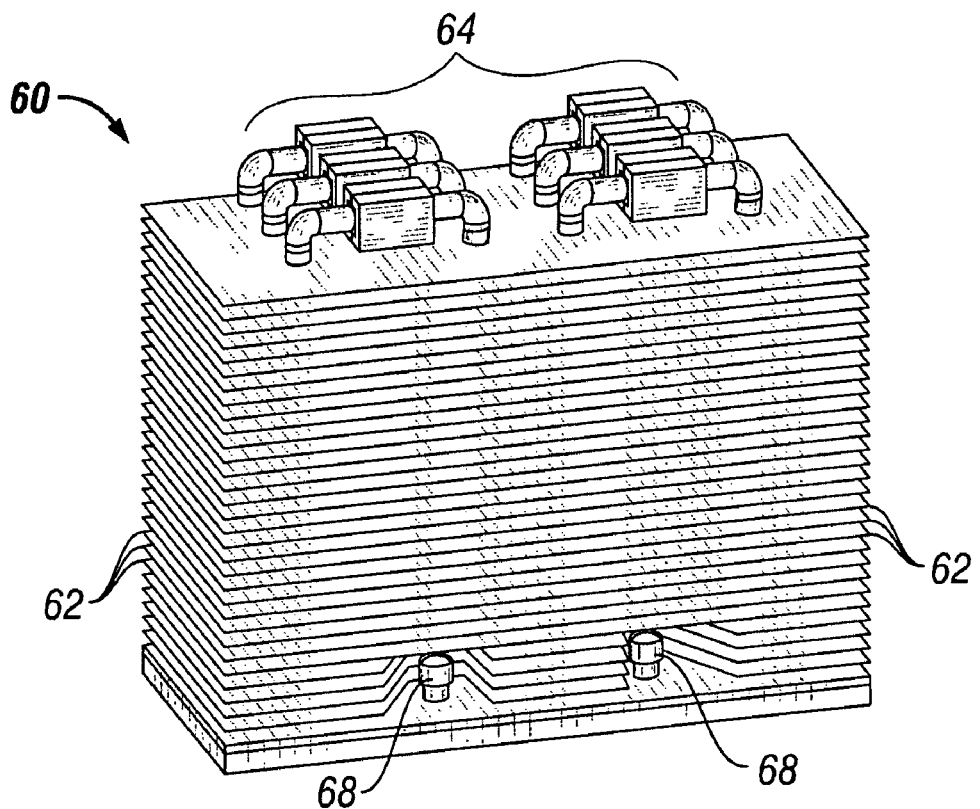
FIG. 4C shows a side view of a heat sink in accordance with an embodiment of the present invention.

In one or more embodiments of the present invention, a heat sink may have a different fin configuration than that shown in FIGS. 4A, 4B, and 4C. Further, those skilled in the art will note that the heat sink 60 shown in FIGS. 4A, 4B, and 4C is not necessarily to scale and is not limited to a particular length, width, and/or height.

Further, although the heat sink 60 shown in FIG. 4A has six pump assemblies 70, in one or more other embodiments of the present invention, a different number of pump assemblies may be used.

Figure 5:
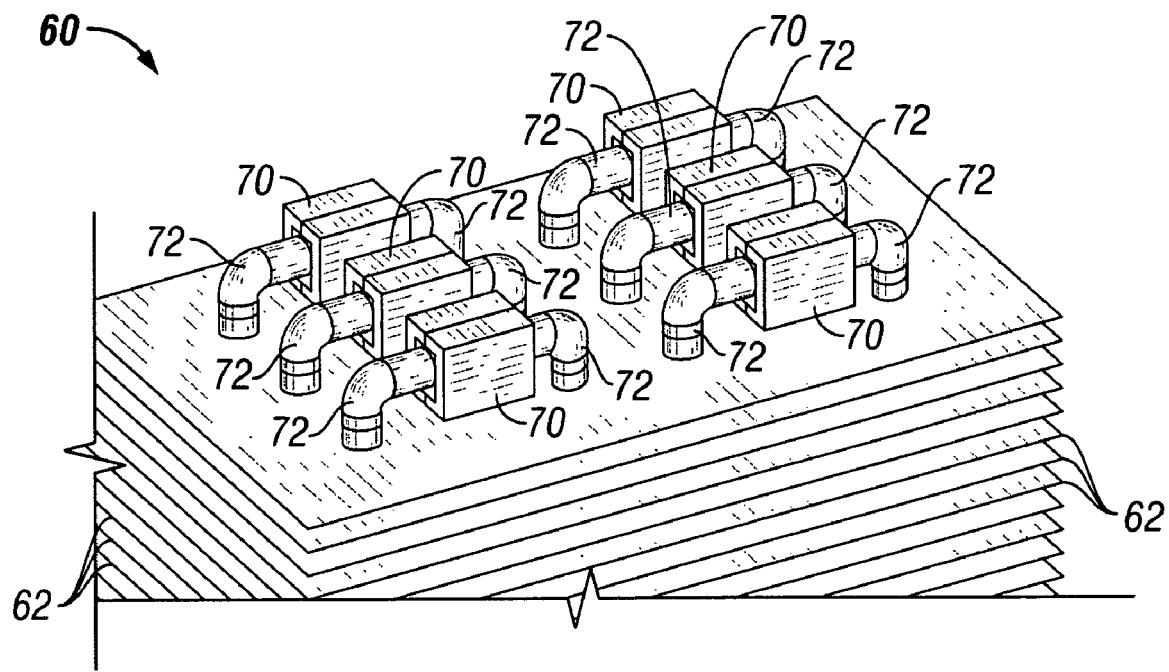
FIG. 5 shows a top view of a heat sink in accordance with an embodiment of the present invention.

FIG. 5 shows a top view of heat sink 60 in accordance with an embodiment of the present invention. A plurality of pump assemblies 70 (further described below with reference to FIGS. 6A-9) are disposed along a top side of the heat sink 60. As shown in FIG. 5, the pump assemblies 70 are rectangular in shape. However, in one or more other embodiments of the present invention, one or more of the pump assemblies 70 may be of a different shape or geometry.

Pipes 72 provide at least portions of channels for fluid flow through each of pump assemblies 70 as further shown and described below with reference to FIGS. 6A-6B. The pipes 72 are connected to the body of the heat sink 60 and may be integrally formed with the heat sink 60. In one or more embodiments of the present invention, portions of the one or more of the pipes 72 residing in respective pump assemblies 70 may be formed of an electrically non-conductive material. Portions of the one or more pipes 72 residing outside from within respective pump assemblies 70 may be formed of an electrically conductive material.

Figure 6A:
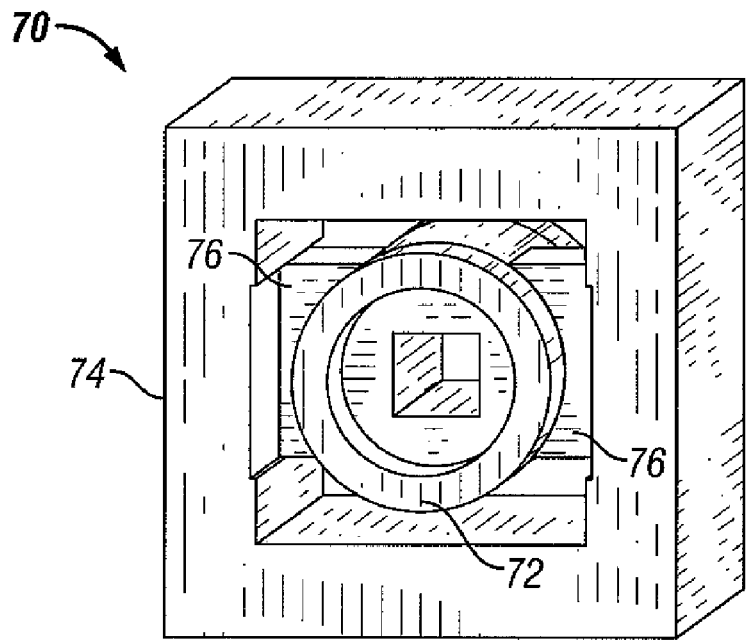
FIG. 6A shows a portion of a heat sink in accordance with an embodiment of the present invention.

FIG. 6A shows a portion of heat sink 60 in accordance with an embodiment of the present invention. Particularly, FIG. 6A shows a cross-sectional view of a pump assembly 70. The pump assembly 70 is at least partially formed of a ferromagnetic metal piece 74 that is connected to magnets 76 that are disposed on opposite sides of pipe 72. The magnets 76 are arranged such that a magnetic field is induced between the magnets 76 across the pipe 72. For example, in one or more embodiments of the present invention, a north pole of a magnet 76 disposed on one side of the pipe 72 faces the pipe 72, while a south pole of a magnet 76 disposed on an opposing side of the pipe 72 faces the pipe 72.

In one or more embodiments of the present invention, the ferromagnetic metal piece 74 may be formed of, for example, iron, nickel, and/or cobalt. Further, in one or more embodiments of the present invention, the ferromagnetic metal piece 74 may be formed of a plurality of ferromagnetic metal pieces. The ferromagnetic metal piece 74 may be used to at least partially shield a magnetic field generated using magnets 76. In one or more other embodiments of the present invention, a ferromagnetic metal piece may be implemented around a pump assembly so as to more fully shield a magnetic field induced by magnets in the pump assembly. In one or more other embodiments of the present invention, a ferromagnetic metal piece may be implemented around a plurality of pump assemblies so as to more fully shield the magnetic fields induced in the plurality of pump assemblies.

Figure 6B:
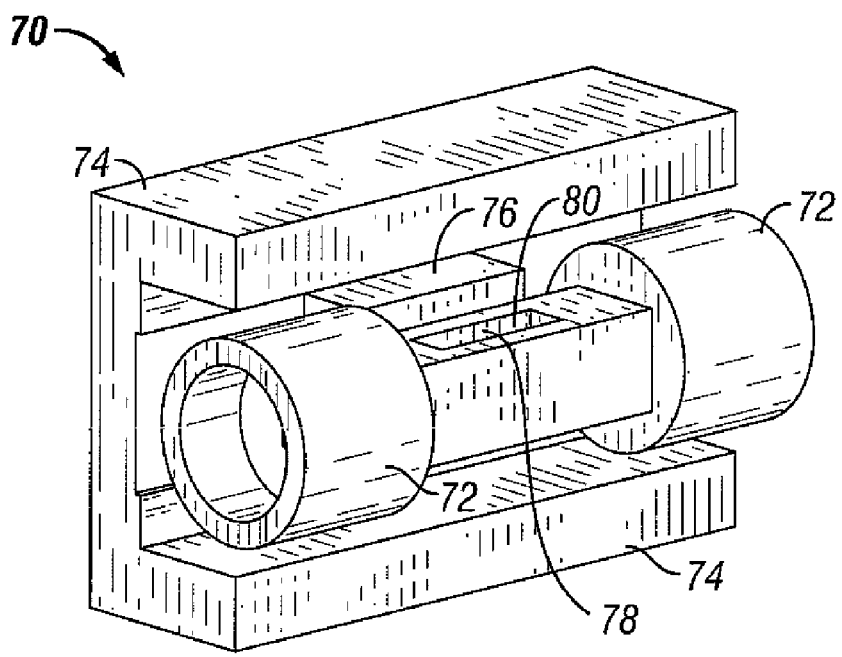
FIG. 6B shows a portion of a heat sink in accordance with an embodiment of the present invention.

Now referring to FIG. 6B, which shows another cross-sectional view of pump assembly 70, the pipe 72 may have circular and rectangular portions. In one or more other embodiments of the present invention, a rectangularly shaped pipe may be integrally joined with a circularly shaped pipe to form pipe 72. Along a portion 80 of one side of the rectangularly shaped portion of pipe 72, an electrically conductive metal piece 78 is disposed. Along a portion of an opposite side of the rectangularly shaped portion of pipe 72, an electrically conductive metal piece 78 may also be disposed.

In one or more embodiments of the present invention, a voltage is applied across electrically conductive metal pieces disposed on either side of pipe 72, thereby causing one of the electrically conductive metal pieces to have a higher voltage that the other, which, in turn, causes electrical current flow between electrically conductive metal pieces 78 and through electrically conductive fluid flowing in pipe 72.

In one or more embodiments of the present invention, an electrically conductive metal piece 78 disposed along a portion of a side of pipe 72 may be, for example, copper foil.

Figure 7:
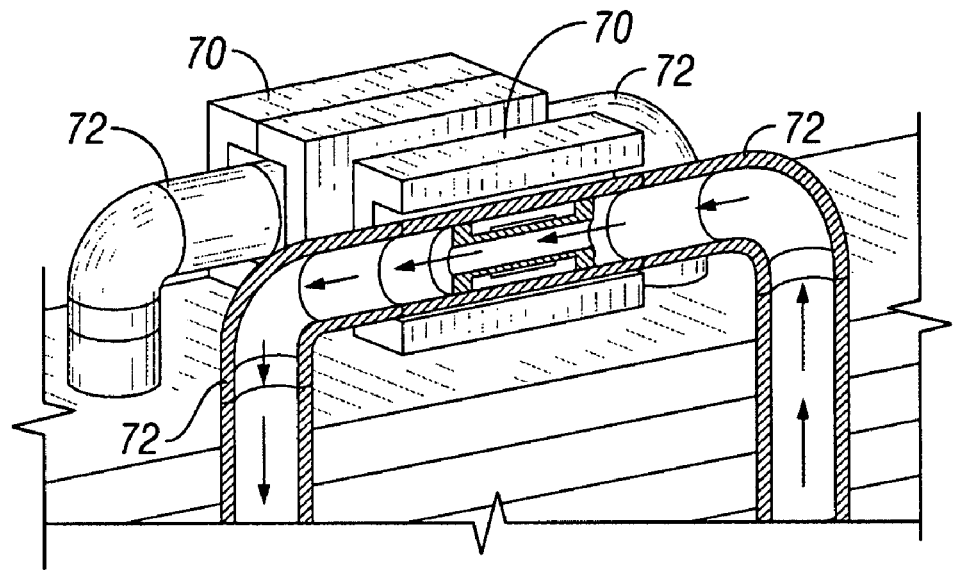
FIG. 7 shows a portion of a heat sink in accordance with an embodiment of the present invention.

FIG. 7 shows a portion of heat sink 60 in accordance with an embodiment of the present invention. The direction of fluid flow (indicated by arrow) in pipe 72 is controlled by the orientation of the poles of magnets 76 and the voltages applied to the electrically conductive metal pieces 78 disposed in pump assembly 70.

Figure 8A:
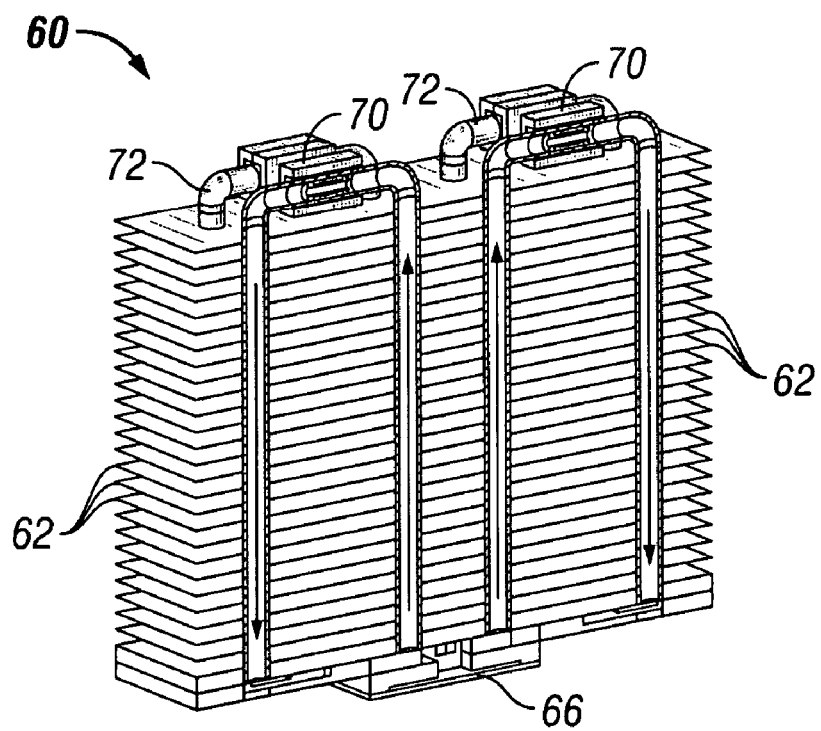
FIG. 8A shows a portion of a heat sink in accordance with an embodiment of the present invention.

FIG. 8A shows a portion of heat sink 60 in accordance with an embodiment of the present invention. Particularly, FIG. 8A shows a cross-section of heat sink 60 with "left" and "right" pump assemblies 70. The description of pump assemblies 70 as being "left" or "right" is only for purposes of description herein and are not intended to limit the scope of the claimed invention.

Figure 8B:
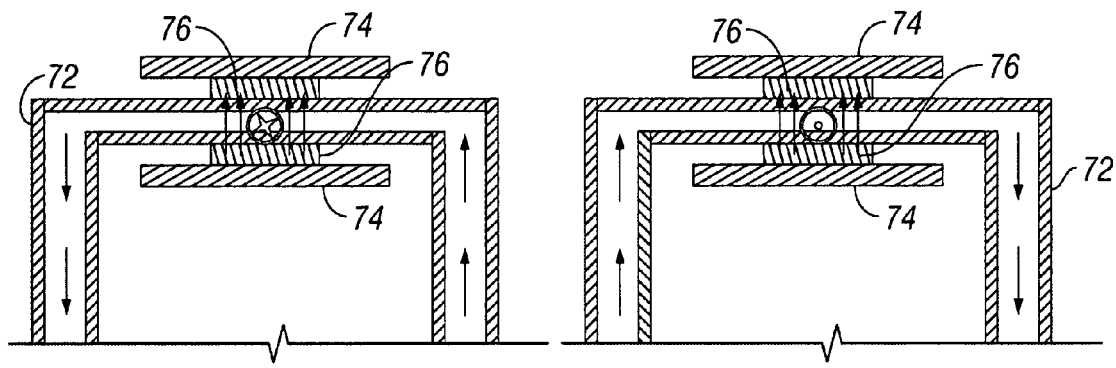
FIG. 8B shows a portion of a heat sink in accordance with an embodiment of the present invention.

The "left" and "right" pump assemblies 70 are configured so as to effectuate particular fluid flow direction (as indicated by arrows) as shown in FIG. 8B. The "left" pump assembly 70 has magnets 76 with poles of opposite polarities disposed on opposing sides of pipe 72, thereby inducing a magnetic field (as indicated by arrows) across the fluid in pipe 72. Because the fluid in pipe 72 may be electrically conductive, when electrically conductive metal pieces 78 are disposed along portions of pipe 72 such that electrical current flow is induced into the paper, fluid in pipe 72 of the "left" pump assembly 70 is propagated in a right-to-left direction as indicated by the arrows in FIG. 8B.

The "right" pump assembly 70 has magnets 76 with poles of opposite polarities disposed on opposing sides of pipe 72, thereby inducing a magnetic field (as indicated by arrows) across the fluid in pipe 72. Because the fluid in pipe 72 may be electrically conductive, when electrically conductive metal pieces 78 are disposed along portions of pipe 72 such that electrical current flow is induced out of the paper, fluid in pipe 72 of the "right" pump assembly 70 is propagated in a left-to-right direction as indicated by the arrows in FIG. 8B.

The strength of the magnetic fields shown in FIG. 8B may be varied by, for example, changing the grade of the magnets 76 and/or adjusting the gap distance of the magnets 76. Those skilled in the art will note that the direction of fluid flow in pipes 72 may be reversed by changing (i) the electrical current direction induced between the electrically conductive metal pieces 78 and/or (ii) the orientation of the poles of magnets 76.

Figure 9:
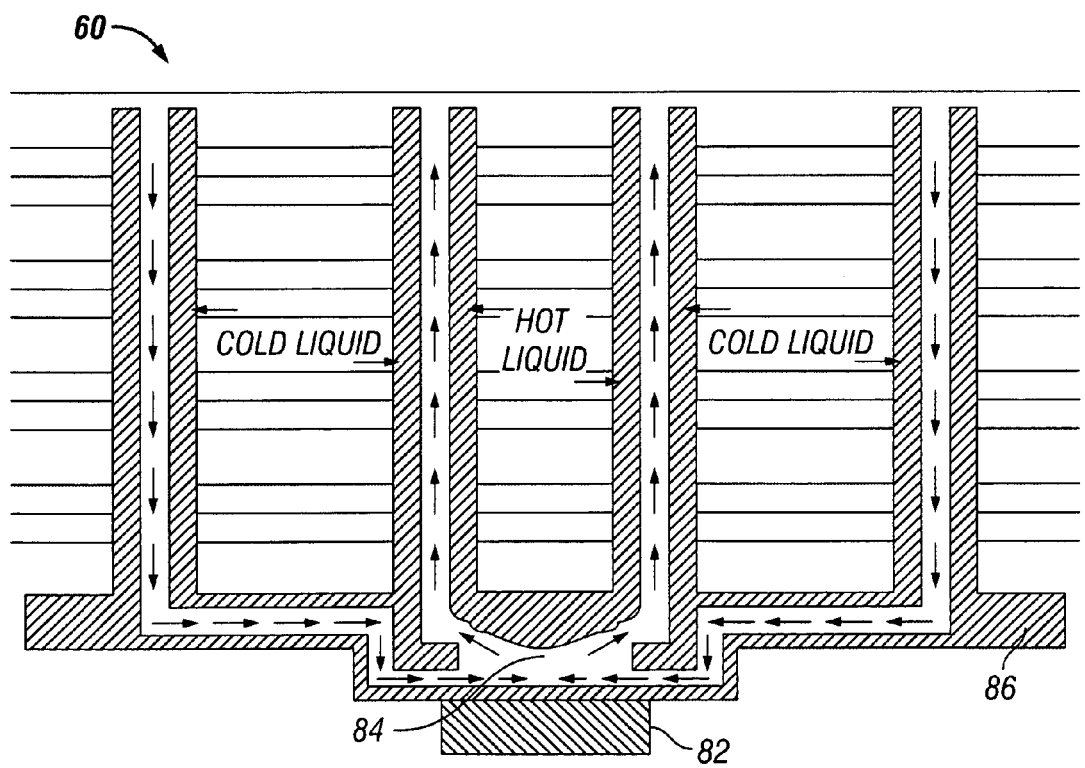
FIG. 9 shows a portion of a heat sink in accordance with an embodiment of the present invention.

FIG. 9 shows a portion of heat sink 60 in accordance with an embodiment of the present invention. By controlling the direction of fluid flow using pump assemblies 70 as shown, for example, in FIG. 8B, cooled liquid may be directed toward a heat source and liquid heated by a heat source may be directed away from the heat source. The fluid in heat sink 60 is thermally conductive, and accordingly, absorbs heat generated by a heat source and dissipates the heat to outside air via, for example, the fins 62 of heat sink 60.

Referring now particularly to FIG. 9, a plurality of pump assemblies (not shown) may be used to circulate fluid (flow indicated by arrows) such that liquid cooled via propagation through heat sink 60 is directed toward a heat source 82 and liquid heated by the heat source 82 is directed away from the heat source 82 for subsequent heat transfer to the heat sink 60 itself. As shown in FIG. 9, "cool" liquid and "heated" liquid mixes in a fluid pool 84 disposed over the heat source 82.

Figure 10:
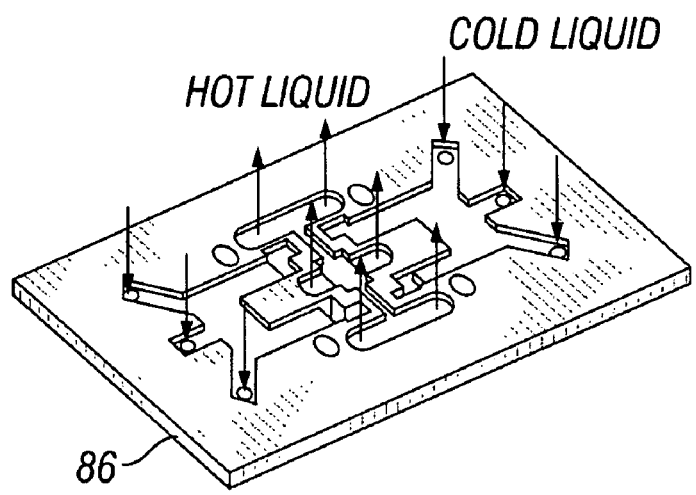
FIG. 10 shows a portion of a heat sink in accordance with an embodiment of the present invention.
Figure 11:
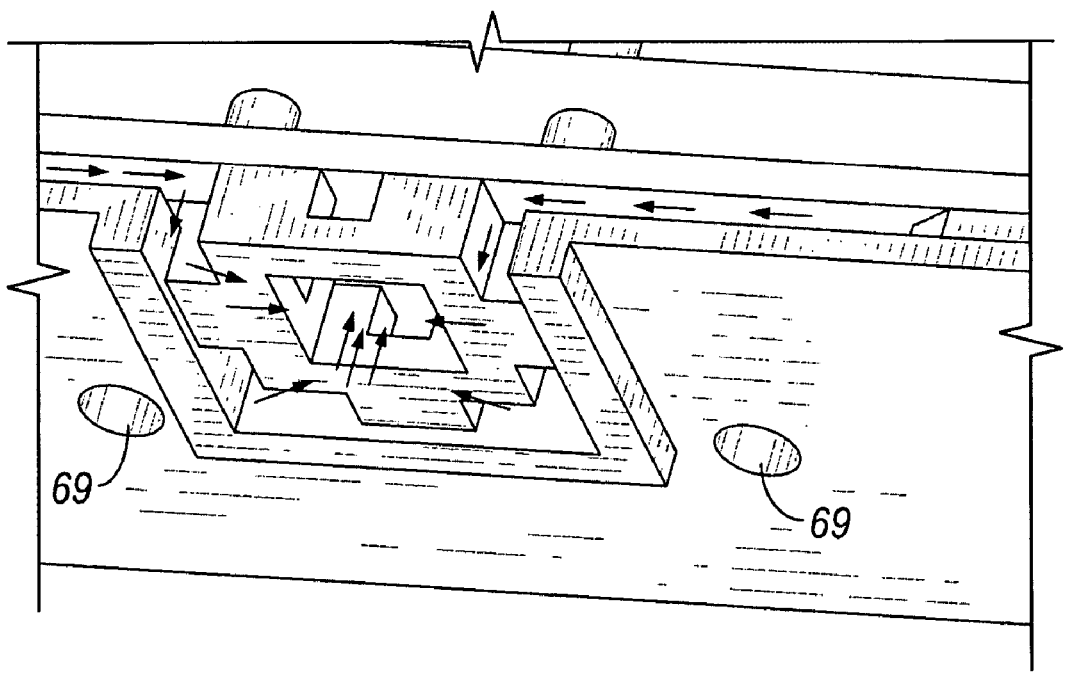
FIG. 11 shows a portion of a heat sink in accordance with an embodiment of the present invention.

The fluid flow shown in FIG. 9 may be further facilitated by use of a base plate 86 and a particular channel configuration within the heat sink 60. For example, FIG. 10 shows a possible configuration of a base plate 86 (potential fluid flow indicated by arrows) that may be used to effectuate the fluid flow shown in FIG. 9. Further, FIG. 11 shows a possible configuration along a bottom portion of heat sink 60 (potential fluid flow indicated by arrows) that may be used to effectuate the fluid flow shown in FIG. 9.

Advantages of the present invention may include one or more of the following. In one or more embodiments of the present invention, because a heat sink uses a pump assembly that generates a magnetic field to drive fluid flow within the heat sink, the fluid flow rate may be increased, thereby resulting in increased heat transfer from a heat source to heat sink fins that dissipate heat to outside air.

In one or more embodiments of the present invention, a heat sink pump assembly for generating a magnetic field to drive fluid flow within the heat sink is at least partially shielded.

In one or more embodiments of the present invention, a heat sink uses a pump assembly for generating a magnetic field to induce particular fluid flow, where "cooled" fluid is directed toward a heat source and "heated" liquid is directed away from the heat source, thereby resulting in a "cooling" of the heat source.

In one or more embodiments of the present invention, a heat sink pump assembly for generating a magnetic field to drive fluid flow within the heat sink is rectangular and compact in design.

In one or more embodiments of the present invention, fluid flow within a heat sink may be easily changed so as to reverse the direction of fluid flow.

In one or more embodiments of the present invention, fluid flow within a heat sink may be reversed by changing the direction of electrical current induced in a pump assembly through which the fluid flows.

In one or more embodiments of the present invention, fluid flow within a heat sink may be reversed by changing the orientation of poles of magnets in a pump assembly though which the fluid flows.

In one or more embodiments of the present invention, a plurality of pump assemblies of a heat sink use separate magnetic fields, thereby providing the ability for particularly controlling fluid flow rates.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A computer system, comprising: an integrated circuit; and
   a heat sink operatively connected to the integrated circuit, the heat sink comprising:
   a pump assembly though which a single channel of thermally and electrically conductive fluid is arranged to flow, the pump assembly arranged to generate a magnetic field across a portion of the single channel residing in the pump assembly, wherein
   a direction of fluid flow in the single channel through the heat sink is dependent on an electrical current induced through the magnetic field;
   the heat sink further comprising:

a pipe arranged to house the single channel, the pipe being arranged to extend though at least a portion of the heat sink.

2. The computer system of claim 1, wherein
the direction of fluid flow in the single channel is away from the integrated circuit through the heat sink to the pump assembly and from the pump assembly through the heat sink toward the integrated circuit.

3. The computer system of claim 1, wherein
the pump assembly is disposed over a top surface of the heat sink.

4. The computer system of claim 1, the pump assembly comprising:
a first magnet disposed on a first side of the portion of the single channel residing in the pump assembly; and
a second magnet disposed along a second side of the portion of the single channel residing in the pump assembly.

5. The computer system of claim 4, wherein
the first magnet and the second magnet are disposed such that a polarity of a side of the first magnet facing the first side is opposite to a polarity of a side of the second magnet facing the second side.

6. The computer system of claim 4, the pump assembly further comprising:
a first electrically conductive metal piece disposed on a first side of the portion of the single channel residing in the pump assembly; and
a second electrically conductive metal piece disposed on a second side of the portion of the single channel residing in the pump assembly.

7. The computer system of claim 6, wherein
an electrical current is induced between the first electrically conductive metal piece and the second electrically conductive metal piece.

8. The computer system of claim 6, wherein
at least one of the first electrically conductive metal piece and the second electrically conductive metal piece is formed of copper.

9. The computer system of claim 1, the pump assembly comprising:
a ferromagnetic metal piece arranged to at least partially shield the magnetic field.

10. The computer system of claim 1, wherein
the pump assembly is rectangular in shape.

11. The computer system of claim 1, the heat sink further comprising:
a recessed portion arranged to hold a pool of liquid disposed over the integrated circuit, wherein fluid is directed by the pump assembly from the pool to one end of the single channel, and
wherein fluid is directed by the pump assembly to the pool from another end of the single channel.

* * * * *

UNITED STATES PATENT AND TRADEMARK OFFICE
CERTIFICATE OF CORRECTION

PATENT NO. : 7,423,874 B2 Page 1 of 1
APPLICATION NO. : 11/219964
DATED : September 9, 2008
INVENTOR(S) : Chien Ouyang It is certified that error appears in the above-identified patent and that said Letters Patent is hereby corrected as shown below:

In Claim 1, column 6, line 59, the word "though" should be --th<u>r</u>ough--.

In Claim 1, column 7, line 2, the word "though" should be --th<u>r</u>ough--.

Signed and Sealed this

Sixteenth Day of December, 2008

JON W. DUDAS
*Director of the United States Patent and Trademark Office*